(12) United States Patent  
Kong et al.

(10) Patent No.: US 11,227,999 B2  
(45) Date of Patent: Jan. 18, 2022

(54) ARRAY SUBSTRATE HAVING A LAYER OF MAGNETIC MATERIAL, DISPLAY PANEL HAVING THE SAME AND MANUFACTURING METHOD THE SAME THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yubao Kong, Beijing (CN); Xuewu Xie, Beijing (CN); Yu Ai, Beijing (CN); Ameng Zhang, Beijing (CN); Bowen Liu, Beijing (CN); Shi Sun, Beijing (CN); Hao Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 16/638,278

(22) PCT Filed: Mar. 1, 2019

(86) PCT No.: PCT/CN2019/076738  
§ 371 (c)(1),  
(2) Date: Feb. 11, 2020

(87) PCT Pub. No.: WO2020/177028  
PCT Pub. Date: Sep. 10, 2020

(65) Prior Publication Data  
US 2021/0217961 A1    Jul. 15, 2021

(51) Int. Cl.  
*H01L 21/00* (2006.01)  
*H01L 51/00* (2006.01)  
(Continued)

(52) U.S. Cl.  
CPC ...... *H01L 51/0016* (2013.01); *H01L 51/5228* (2013.01); *H01L 51/56* (2013.01);  
(Continued)

(58) Field of Classification Search  
CPC ............. H01L 51/0016; H01L 51/5228; H01L 51/5012; H01L 27/3276; H01L 27/323; H01L 2251/5315  
See application file for complete search history.

(56) References Cited

U.S. PATENT DOCUMENTS 9,023,678 B2    5/2015  Heo et al.  
2002/0158835 A1  10/2002  Kobayashi et al.  
(Continued)

FOREIGN PATENT DOCUMENTS

| CN | 103515413 A | 1/2014 |
| CN | 107799575 A | 3/2018 |
| CN | 108470749 A | 8/2018 |

OTHER PUBLICATIONS

Office Action dated Dec. 26, 2019, issued in counterpart CN Application No. 201980000222.4, with English translation (8 pages).  
International Search Report dated Nov. 28, 2019, issued in Application No. PCT/CN2019/076738 (10 pages).

*Primary Examiner* — Phuc T Dang  
(74) *Attorney, Agent, or Firm* — Westerman, Hattori, Daniels & Adrian, LLP (57) ABSTRACT

The present disclosure is related to a method of manufacturing an array substrate. The method of manufacturing an array substrate may include forming an auxiliary cathode on a base substrate, forming a layer of magnetic material on a first surface of the auxiliary cathode, forming an emission  
(Continued)

layer in a display area of the array substrate, a part of the emission layer on the layer of the magnetic material on the first surface of the auxiliary cathode, and removing the part of the emission layer and the layer of magnetic material from the first surface of the auxiliary cathode.

20 Claims, 5 Drawing Sheets

(51) Int. Cl.
    *H01L 51/52*     (2006.01)
    *H01L 51/56*     (2006.01)
    *H01L 27/32*     (2006.01)
    *H01L 51/50*     (2006.01)

(52) U.S. Cl.
    CPC ...... *H01L 27/3276* (2013.01); *H01L 51/5012* (2013.01); *H01L 2227/323* (2013.01); *H01L 2251/5315* (2013.01)

(56) References Cited

U.S. PATENT DOCUMENTS

| | | | | |
|---|---|---|---|---|
| 2003/0183830 | A1* | 10/2003 | Yamazaki | H01L 27/32 257/90 |
| 2017/0025610 | A1* | 1/2017 | Kwon | H01L 51/0018 |
| 2018/0190907 | A1* | 7/2018 | Kim | G03F 7/095 |
| 2019/0074338 | A1* | 3/2019 | Gu | H01L 51/5228 |

\* cited by examiner

ARRAY SUBSTRATE HAVING A LAYER OF MAGNETIC MATERIAL, DISPLAY PANEL HAVING THE SAME AND MANUFACTURING METHOD THE SAME THEREOF

TECHNICAL FIELD

This disclosure relates to display technology, more particularly, to n array substrate, a display panel, and a manufacturing method thereof.

BACKGROUND

An organic light-emitting diode (OLED) display panel includes organic electroluminescent diodes. Since the OLED display panel contains self-illuminating organic electroluminescent diodes, it does not require a backlight. Furthermore, the OLED display panel has become very popular because of advantages such as high contrast, thin thickness, wide viewing angle, fast response speed, being capable of making flexible panels, wide temperature range, simple structure, and simple process.

BRIEF SUMMARY

Some embodiments of the present disclosure provide a method of manufacturing an array substrate. The manufacturing method can effectively remove the emission layer (EL) material deposited by evaporation on the auxiliary cathode so that the cathode can be effectively in contact with the auxiliary cathode. As such, the cathode resistance can be reduced. Furthermore, the whole manufacturing method can be performed in a vacuum environment without any chemical reaction involved. Thus, secondary pollution can be avoided. Furthermore, the success rate of contacting between the cathode and the auxiliary cathode is also high.

Accordingly, one example of the present disclosure is a method of manufacturing an array substrate. The method of manufacturing the array substrate may include forming an auxiliary cathode on a base substrate, forming a layer of magnetic material on a first surface of the auxiliary cathode, forming an emission layer in a display area of the array substrate, a part of the emission layer on the layer of the magnetic material on the first surface of the auxiliary cathode, and removing the part of the emission layer and the underneath layer of magnetic material from the first surface of the auxiliary cathode.

Another example of the present disclosure is an array substrate. The array substrate is made by the method of manufacturing the array substrate according to one embodiment of the present disclosure.

Another example of the present disclosure is an OLED display panel. The display panel may include an array substrate according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-5. When referring to the figures, like structures and elements shown throughout are indicated with like reference numerals.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covers", "on", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

In addition, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

A numerical range modified by "about" herein means that the upper and lower limits of the numerical range can vary by 10% thereof.

A top-emitting OLED display panel emits light from a side of a cathode electrode layer, Materials for forming the transparent cathode electrode of top emitting displays are well known in the art and include transparent conductive oxides (TCO's), such as indium tin oxide (ITO); thin layers of metal, such as Al or a Mg/Ag alloy, having a thickness on the order of 20 nm; and conductive polymers such as polythiophene. The cathode electrode is usually very thin to ensure transmittance. However, such thin cathode electrode leads to an increase in block resistance of the cathode electrode. When the size of the display panel is getting larger and larger, the resistance of the cathode electrode is also getting larger and larger, thereby resulting in the resistance value in the middle of the panel being higher than the resistance value at the edges of the panel. As such, the resulting large IR drop across the panel causes the brightness of the panel to be uneven. This has become one of main technical problems that restrict the development of large-size OLED displays.

Figure 1:
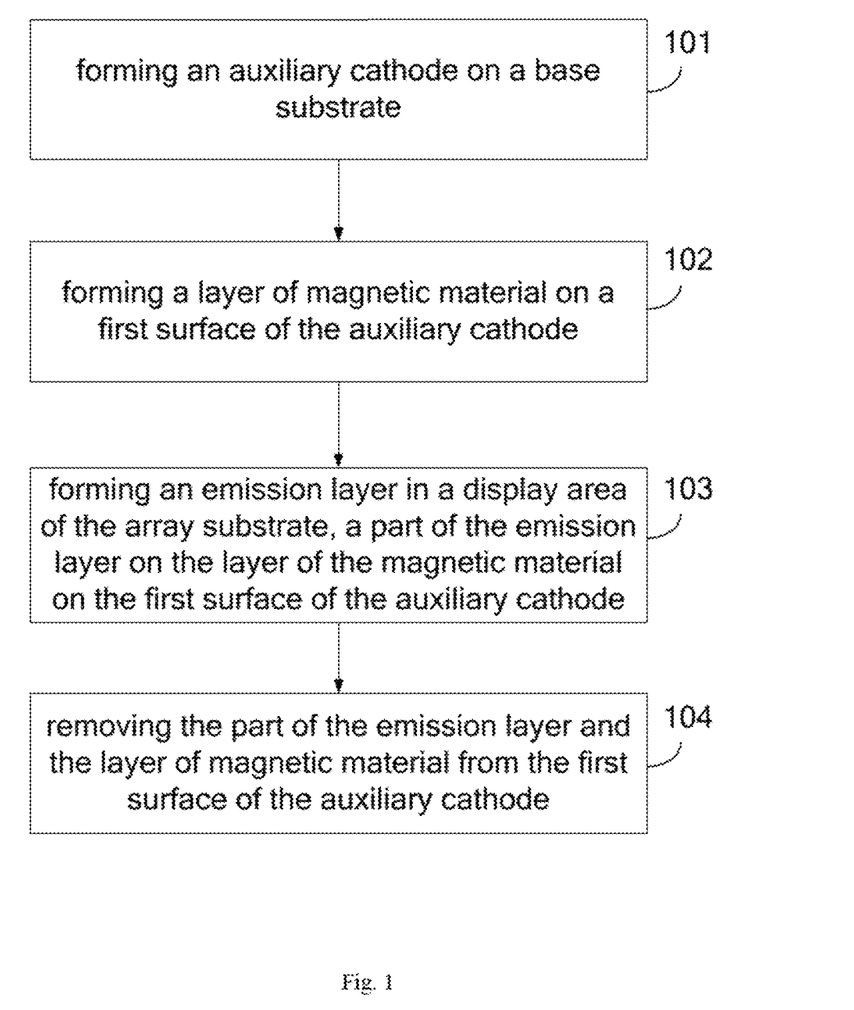
FIG. 1 is a schematic flowchart of a method of manufacturing an array substrate according to some embodiments of the disclosure.

One example of the present disclosure is a method of manufacturing an array substrate. As shown in FIG. 1, the method of manufacturing the array substrate may include the following steps 101-104.

Step 101 includes forming an auxiliary cathode on a base substrate.

Step 102 includes forming a layer of magnetic material on a first surface of the auxiliary cathode.

Step 103 includes forming an emission layer in a display area of the array substrate. A part of the emission layer is formed on the layer of the magnetic material on the first surface of the auxiliary cathode.

Step 104 includes removing the part of the emission layer and the underneath layer of magnetic material from the first surface of the auxiliary cathode.

Figure 2:
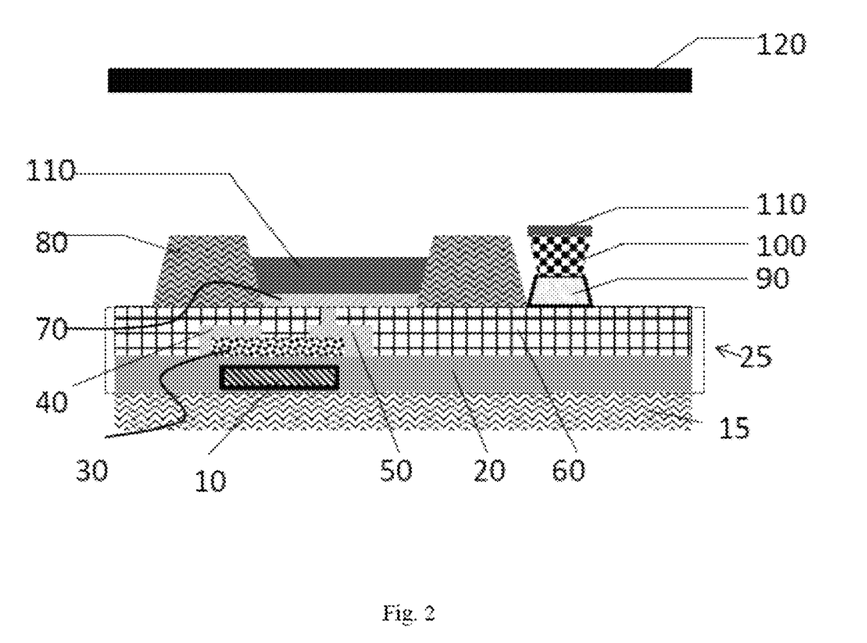
FIG. 2 is a schematic diagram illustrating a method of manufacturing an array substrate according to some embodiments of the disclosure.

Before forming the auxiliary cathode, as shown in FIG. 2, the method of manufacturing the array substrate may further include forming a thin film transistor (TFT) layer 25 on the base substrate 15, and forming an anode 70 on the thin film transistor layer 25. The thin film transistor layer 25 may include a gate metal layer 10, a gate insulating (GI) layer 20, an active layer 30, a source 40 and a drain 50, a second insulating layer 60. The gate metal layer 10 may be formed in the GI layer 20. The active layer 30, the source 40 and the drain 50 may be formed in the second insulating layer 60. Furthermore, a pixel defining layer (PDL) 80 may be formed on the TFT layer 25. The PDL 80 can define a plurality of openings in the display area of the array substrate. The anode 70 may be formed in each of the plurality of openings on the TFT layer.

In some embodiments, as shown in FIG. 2, the method of manufacturing the array substrate includes forming an auxiliary cathode 90 on a base substrate 15. In one embodiment, the base substrate is a glass substrate. The auxiliary cathode may be formed on the TFT layer between the pixels by an exposure technique or an inkjet printing technique. The auxiliary cathode is not required to be transparent and therefore can be of a higher conductivity than the transparent cathode electrode. The auxiliary cathode may include conductive metals such as Al, Ag, Cu, and/or Au.

In one embodiment, as shown in FIG. 2, the auxiliary cathode 90 is formed in an area outside the opening. The auxiliary cathode may be formed in the same layer or in the same step as the anode.

After forming the auxiliary cathode 90, as shown in FIG. 2, the method of manufacturing the array substrate may further include forming a layer of magnetic material 100 on a first surface of the auxiliary cathode 90. The first surface may be a top surface of the auxiliary cathode, which is in parallel with the base substrate and at a side opposite from the base substrate. In one embodiment, the layer of the magnetic material preferably covers the entire first surface of the auxiliary cathode. In one embodiment, the layer of the magnetic material on the first surface of the auxiliary cathode is formed by an exposing technique or an inkjet printing technique. In one embodiment, the layer of the magnetic material on the first surface of the auxiliary cathode is formed by an exposing technique after an initial magnetic material is formed, such as coating, sputtering. In one embodiment, after forming the auxiliary cathode on a base substrate, the initial magnetic material is coated on the auxiliary cathode and then the initial magnetic material is exposed to keep material in a region corresponding to the auxiliary cathode and remove material outside the region. In one embodiment, the initial magnetic material is formed on the auxiliary cathode at fixed point (that is, on the region corresponding to the auxiliary cathode) by inkjet printing.

In one embodiment, the layer of the magnetic material has a thickness in a range of about 0.5 µm to about 10 µm, preferably about 1 µm to about 3 µm.

The magnetic material according to some embodiments of the present disclosure is not particularly limited. Preferably, the magnetic material has strong magnetic properties so that it can be sucked away by an electromagnet during the following removal step. Furthermore, when the ambient temperature is above 100° C., adhesion between the magnetic material and the underneath auxiliary cathode may be greatly reduced, thereby facilitating removal of the magnetic material from the underneath auxiliary cathode during the following removal step.

In some embodiments, the layer of the magnetic material may include some magnetic powder fillers and an adhesive. The magnetic powder fillers may include at least one from the group consisting of iron cobalt, iron nickel, iron samarium, iron samarium boron, iron aluminum nickel, and mixtures thereof. The volume fraction, C, of magnetic powder fillers can be calculated according to the formula below:

$$Br=2.2*10^{-3}*C+0.003,$$

where Br is the residual magnetization of the magnetic powder fillers, which is a known parameter for a particular metal or a metal mixture. Thus, the volume fraction, C, of magnetic powder fillers in the layer of magnetic material can be calculated. In one embodiment, the magnetic powder fillers may be present at 16% to 22%, preferably at 18% to 20%, by weight of the layer of the magnetic material.

In some embodiments, the adhesive may include a polymer. For example, the adhesive may include a rubber or an acrylic-based polymer. In one embodiment, an adhesion force between the layer of the magnetic material and the auxiliary cathode decreases at a high temperature, for example, at a temperature of more than 100° C. or 110° C. As such, when the emission layer is formed on the layer of magnetic material at a high temperature in the following steps, the adhesion force between the layer of the magnetic material and the auxiliary cathode is weakened, thereby facilitating removal of the emission layer and the layer of the magnetic material by a magnetic force.

After forming the layer of magnetic material 100 on the first surface of the auxiliary cathode 90, as shown in FIG. 2, the method of manufacturing the array substrate may further include forming an emission layer 110 in a display area of the array substrate. A part of the emission layer 110 is formed on the layer of the magnetic material 100 on the first surface of the auxiliary cathode 90. In one embodiment, the emission layer is deposited in the display area of the array substrate by thermal evaporation. The thermal evaporation may be performed at a high temperature, for example, in a range of 100° C. to 160° C. preferably in a range of 110° C. to 150° C. more preferably in a range of 120° C. to 135° C. The emission layer may include at least one selected from the group consisting of an electron transport layer, an electron injection layer, a light emitting layer, a hole transport layer, and a hole injection layer.

After forming the emission layer 110, as Shown in FIG. 2, the method of manufacturing the array substrate may further include removing the part of the emission layer 110 and the underneath layer of magnetic material 100 from the first surface of the auxiliary cathode 90. In one embodiment, this removing step includes placing an electromagnet 120 at a position over the base substrate; energizing the electromagnet 120 to make the electromagnet 120 magnetic so that the layer of the magnetic material and the part of the emission layer on the layer of the magnetic material are attracted and attached to the electromagnet 120 by magnetic force; and removing the electromagnet 120 with the layer of the magnetic material and the part of the emission layer on the layer of the magnetic material.

In one embodiment, during the removing step, the electromagnet may be moved from a left side of the array substrate to a right side of the array substrate at a low speed above the array substrate. An electric current is provided to the electromagnet so that the electromagnet exhibits magnetic property. Once the electromagnet is above the array substrate, the layer of the magnetic material and the part of the emission layer on the layer of the magnetic material are attracted and attached to the electromagnet by the magnetic force. After the electromagnet and the attached layer of the magnetic material and the part of the emission layer are moved away from the array substrate to, for example, a waste disposal area, the electrical current is turned off, and the electromagnet loses the magnetic property. As such, the layer of the magnetic material and the part of the emission layer on the layer of the magnetic material are removed from the electromagnet and may be discarded into the designated waste disposal area.

Figure 3:
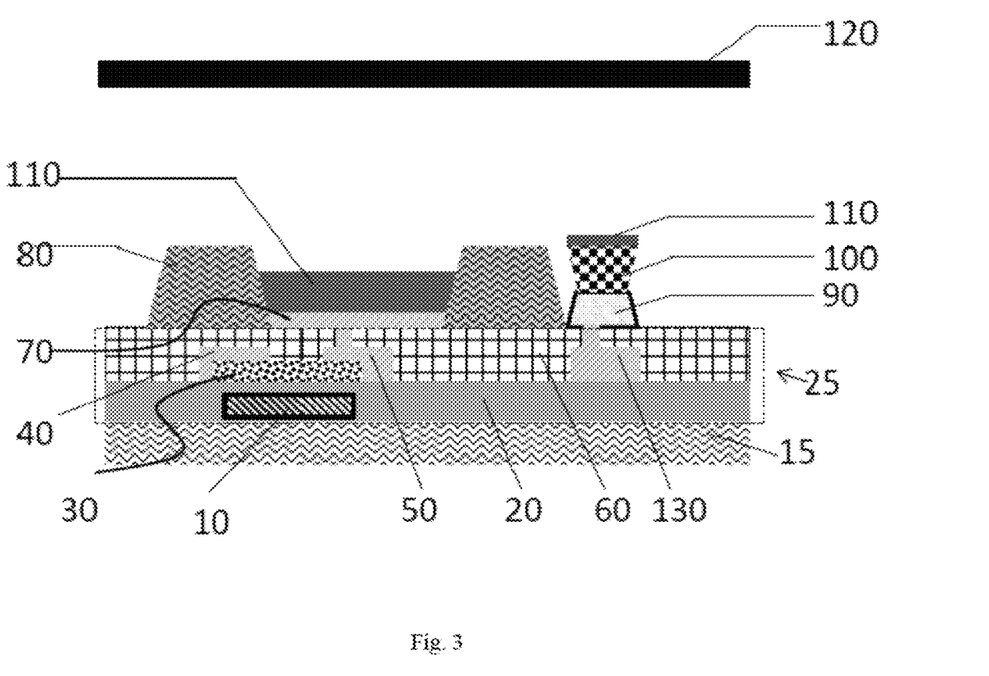
FIG. 3 is a schematic diagram illustrating a method of manufacturing an array substrate according to some embodiments of the disclosure.

In one embodiment, as shown in FIG. 3, the method of manufacturing the array substrate includes a step of forming an auxiliary cathode, which includes forming a first auxiliary cathode 130 and a second auxiliary cathode 90. The first auxiliary cathode 130 may be formed and embedded in the second insulating layer 60. The first auxiliary cathode 130 may be formed in the same layer or in a same step as the source and the drain. The second auxiliary cathode 90 may be formed in the same layer or in a same step as the anode by an exposing technique or an inkjet printing technique. The second auxiliary cathode 90 is electrically coupled to the first auxiliary cathode 130 through a via hole in the second insulating layer. Furthermore, the method of manufacturing the array substrate may include forming the layer of magnetic material and a part of an emission layer sequentially on the fast surface of the second auxiliary cathode. The first surface of the second auxiliary cathode is a top surface of the second auxiliary cathode, which is in parallel with and at a side opposite from the base substrate. During the removing step, the part of the emission layer 110 and the underneath layer of magnetic material 100 are removed from the first surface of the second auxiliary cathode 90, far example, by an electromagnet.

Figure 4:
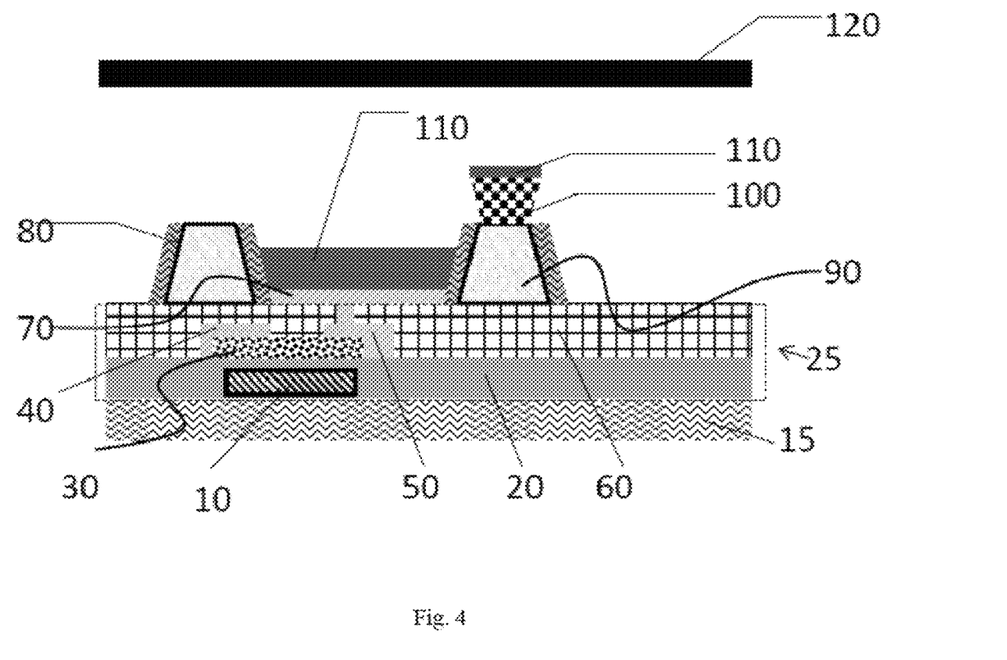
FIG. 4 is a schematic diagram illustrating a method of manufacturing an array substrate according to some embodiments of the disclosure.

In one embodiment, as shown in FIG. 4, a hollow pixel defining layer 80 is formed first on the TFT layer. Then, the step of forming the auxiliary cathode includes forming the auxiliary cathode 90 inside the hollow pixel defining layer 80, for example, by an inkjet printing technique. A first, top surface of the auxiliary cathode 90 is exposed outside the pixel defining layer 80. Then, a layer of magnetic material 100 and a part of the emission layer 110 are sequentially formed on the exposed first surface of the auxiliary cathode 90. During the removing step, the part of the emission layer 110 and the underneath layer of magnetic material 100 are removed from the exposed first surface of the auxiliary cathode 90, for example, by an electromagnet. In one embodiment, a cross-section of the auxiliary cathode in a plane perpendicular to the base substrate has a trapezoid shape.

Figure 5:
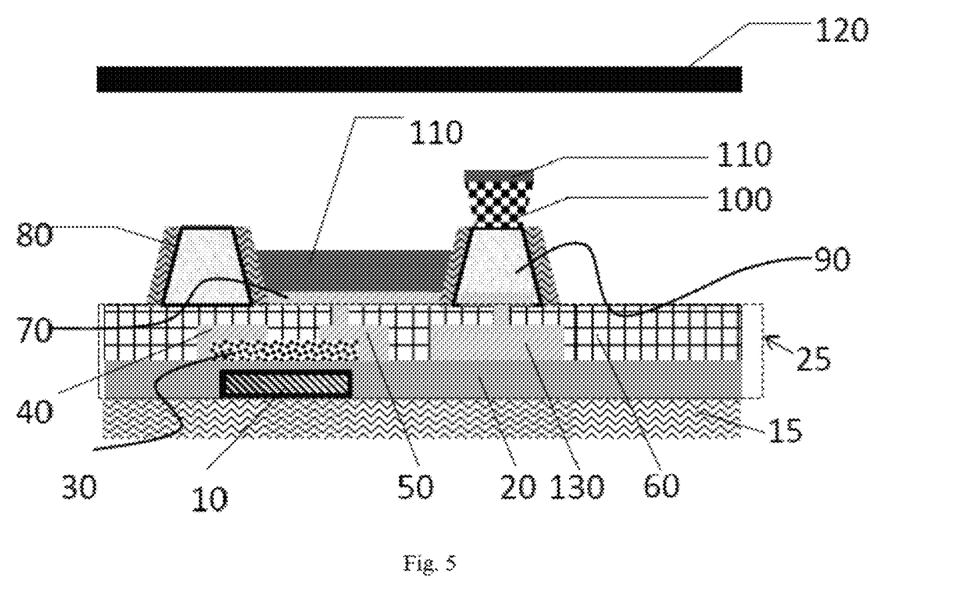
FIG. 5 is a schematic diagram illustrating a method of manufacturing an array substrate according to some embodiments of the disclosure.

In one embodiment, as shown in FIG. 5, the step of forming the auxiliary cathode includes forming a first auxiliary cathode 130 and a second auxiliary cathode 90. The first auxiliary cathode 130 may be formed and embedded in the second insulating layer 60 underneath the PDL layer. The first auxiliary cathode 130 may be formed in the same layer as the source and the drain. Then, a hollow pixel defining layer 80 is formed on the TFT layer, and the second auxiliary cathode 90 may be formed inside the hollow pixel defining layer 80, for example, by an inkjet printing technique. A first, top surface of the auxiliary cathode 90 is exposed outside the pixel defining layer. The second auxiliary cathode 90 is electrically coupled to the first auxiliary cathode 130 through a via hole in the second insulating layer 60. Then, a layer of magnetic material 100 and a part of the emission layer 110 are sequentially formed on the exposed first surface of the second auxiliary cathode 90. During the removing step, the part of the emission layer 110 and the underneath layer of magnetic material 100 are removed from the exposed first surface of the second auxiliary cathode 90, for example, by an electromagnet.

After removing the part of the emission layer 110 and the underneath layer of magnetic material 100 from the first surface of the auxiliary cathode 90, the method of manufacturing the array substrate may further include forming a cathode in the display area. The cathode may be electrically coupled to the auxiliary cathode. In one embodiment, the cathode is formed by an evaporation deposition technique. Because the emission layer and the layer of magnetic material on the first surface of the auxiliary cathode have been removed, the cathode is in direct contact with the first surface of the auxiliary cathode. Because the part of the emission layer and the underneath layer of the magnetic material are removed from the first surface of the auxiliary cathode during the removing step, the cathode may have an excellent direct contact with the first surface of the auxiliary cathode.

In some embodiments of the present disclosure, a method of manufacturing an array substrate is provided to solve the problem that the cathode resistance is too high. The uniformity of the brightness of the panel can be improved significantly. The method according to some embodiments of the present disclosure can completely remove the EL material on the first surface of the auxiliary cathode. Thus, the contacting area between the cathode and the auxiliary cathode is increased, thereby reducing the cathode resistance and solving the IR drop problem. In some embodiments, the auxiliary cathode can be formed in the same step with the gate layer, the source and the drain, or the anode layer. Thus, there is no need to add a separate step of forming the auxiliary cathode. Furthermore, to facilitate removal of the magnetic material from the auxiliary cathode, the magnetic material can be configured so that the high temperature during evaporation deposition of the EL layer can increase aging of the magnetic adhesive and thus reduce the adhesion between the magnetic adhesive and the first surface of the auxiliary cathode. Furthermore, a layer of magnetic material is utilized to remove all EL material on the first surface of the auxiliary cathode, so that the contact area between the auxiliary cathode and the cathode is large, thereby effectively reducing the cathode resistance. Furthermore, the whole manufacturing, method can be performed in a vacuum environment without chemical reaction involved. Thus, secondary pollution can be avoided. Furthermore, the success rate of contacting between the cathode and the auxiliary cathode is high.

Another example of the present disclosure is an array substrate manufactured by the method of manufacturing the array substrate according to one embodiment of the present disclosure. Because the emission layer on the first surface of the auxiliary cathode is removed, the contact between the cathode and the auxiliary cathode is excellent. As such, the cathode resistance is low.

Another example of the present disclosure is an OLED display panel. The OLED display panel may include the array substrate according to one embodiment of the present disclosure. In one embodiment, the OLED display panel is a top emission type display panel.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical embodiment is not limited to the specific combination of the technical features, and also should covered other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:

1. A method of manufacturing an array substrate, comprising:
   forming an auxiliary cathode on a base substrate;
   forming a layer of magnetic material on a first surface of the auxiliary cathode;
   forming an emission layer in a display area of the array substrate, a part of the emission layer on the layer of the magnetic material on the first surface of the auxiliary cathode; and
   removing the part of the emission layer and the layer of magnetic material from the first surface of the auxiliary cathode.

2. The method of manufacturing an array substrate according to claim 1, wherein removing the part of the emission layer and the layer of magnetic material from the first surface of the auxiliary cathode comprises:
   placing an electromagnet at a position over the base substrate;
   energizing the electromagnet to make the electromagnet magnetic so that the layer of the magnetic material and the part of the emission layer on the layer of the magnetic material are attached to the electromagnet by magnetic force; and
   removing the electromagnet with the layer of the magnetic material and the part of the emission layer on the layer of the magnetic material.

3. The method of manufacturing an array substrate according to claim 1, further comprising:
   forming a cathode in the display area,
   wherein the cathode is electrically coupled to the auxiliary cathode.

4. The method of manufacturing an array substrate according to claim 1, wherein the layer of the magnetic material is formed on the entire first surface of the auxiliary cathode.

5. The method of manufacturing an array substrate according to claim 1, wherein forming the layer of the magnetic material on the first surface of the auxiliary cathode is performed by exposing or inkjet printing.

6. The method of manufacturing an array substrate according to claim 1, wherein the emission layer is formed in the display area of the array substrate by thermal evaporation.

7. The method of manufacturing an array substrate according to claim 6, wherein the thermal evaporation is performed at a temperature in a range of 100° C. to 160° C.

8. The method of manufacturing an array substrate according to claim 1, before forming the auxiliary cathode, further comprising:
   forming a thin film transistor layer on the base substrate, and forming an anode on the thin film transistor layer;
   wherein the thin film transistor layer comprises a gate metal layer, and a source and drain.

9. The method of manufacturing an array substrate according to claim 1, wherein the auxiliary cathode comprises Al or Mo.

10. The method of manufacturing an array substrate according to claim 1, wherein the layer of the magnetic material has a thickness in a range of about 1 um to about 3 um.

11. The method of manufacturing an array substrate according to claim 1, wherein the layer of the magnetic material comprises magnetic powder fillers and an adhesive.

12. The method of manufacturing an array substrate according to claim 11, wherein the magnetic powder fillers comprise at least one from the group consisting of iron cobalt, iron nickel, iron samarium, iron samarium boron, iron aluminum nickel, and mixtures thereof.

13. The method of manufacturing an array substrate according to claim 12, wherein the magnetic powder fillers are present at 16% to 22% by weight of the layer of the magnetic material.

14. The method of manufacturing an array substrate according to claim 11, wherein the adhesive comprises a rubber or an acrylic-based polymer.

15. The method of manufacturing an array substrate according to claim 14, wherein an adhesion force between the layer of the magnetic material and the auxiliary cathode decreases at a temperature of more than 100° C.

16. The method of manufacturing an array substrate according to claim 1, wherein the emission layer comprises at least one selected from the group consisting of an electron transport layer, an electron injection layer, a light emitting layer, a hole transport layer, and a hole injection layer.

17. The method of manufacturing an array substrate according to claim 1, wherein the base substrate is a glass substrate.

18. An array substrate manufactured by the method of claim 1.

19. An OLED display panel comprising the array substrate of claim 18.

20. The OLED display panel of claim 19, wherein the OLED display panel is a top emission type display panel.

* * * * *